(12) United States Patent
Jun et al.

(10) Patent No.: US 12,191,190 B2
(45) Date of Patent: Jan. 7, 2025

(54) SUBSTRATE PROCESSING CHAMBER, SUBSTRATE PROCESSING SYSTEM INCLUDING THE SAME, AND SUBSTRATE PROCESSING METHOD USING THE SAME

(71) Applicant: SAMSUNG ELECTRONICS CO., LTD., Suwon-si (KR)

(72) Inventors: Yongmyung Jun, Hwaseong-si (KR); Hyunjin Ko, Hwaseong-si (KR); Seohyun Kim, Hwaseong-si (KR); Jae Seong Ryu, Hwaseong-si (KR); Inkwang Bae, Hwaseong-si (KR); Seungbu Baek, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 73 days.

(21) Appl. No.: 17/737,490

(22) Filed: May 5, 2022

(65) Prior Publication Data

US 2023/0043451 A1   Feb. 9, 2023

(30) Foreign Application Priority Data

Aug. 3, 2021   (KR) .................. 10-2021-0101884

(51) Int. Cl.
*H01L 21/687* (2006.01)
*H01L 21/67* (2006.01)

(52) U.S. Cl.
CPC .. *H01L 21/68742* (2013.01); *H01L 21/67051* (2013.01); *H01L 21/67242* (2013.01); *H01L 21/68785* (2013.01); *H01L 21/67017* (2013.01); *H01L 21/67103* (2013.01); *H01L 21/6719* (2013.01); *H01L 21/67253* (2013.01)

(58) Field of Classification Search
CPC ......... H01L 21/68785; H01L 21/67242; H01L 21/67103; H01L 21/67253; H01L 21/68742; H01L 21/6719; H01L 21/67017; H01L 21/67051
See application file for complete search history.

(56) References Cited

U.S. PATENT DOCUMENTS

| | | | |
|---|---|---|---|
| 6,221,171 B1 * | 4/2001 | Maekawa | H01L 21/67051 134/32 |
| 10,083,829 B2 | 9/2018 | Jeong et al. | |
| 10,985,036 B2 | 4/2021 | Kim et al. | |
| 2003/0106575 A1 | 6/2003 | Moon et al. | |

(Continued)

FOREIGN PATENT DOCUMENTS

| | | | |
|---|---|---|---|
| JP | H1092781 A | * | 6/1997 |
| JP | 2007-27696 A | | 2/2007 |

(Continued)

OTHER PUBLICATIONS

Machine Translation of KR 102204024. (Year: 2021).*

*Primary Examiner* — Benjamin L Osterhout
(74) *Attorney, Agent, or Firm* — Sughrue Mion, PLLC

(57) ABSTRACT

A substrate processing chamber includes a housing providing a process space; a spin apparatus provided in the housing; and a fluid spraying nozzle configured to spray fluid into the process space, wherein the spin apparatus includes: a spin chuck configured to support a substrate; a rotation driving part configured to rotate the spin chuck; and a weight sensor configured to measure a weight of the substrate supported on the spin chuck.

10 Claims, 16 Drawing Sheets

(56) References Cited

U.S. PATENT DOCUMENTS

2007/0012337 A1    1/2007  Hillman et al.
2020/0411344 A1   12/2020  Choi et al.
2022/0152780 A1 *  5/2022  Douki ............... H01L 21/67057

FOREIGN PATENT DOCUMENTS

| | | | | |
|---|---|---|---|---|
| JP | 2019162706 A | * | 9/2019 | |
| KR | 1020030048682 A | | 6/2003 | |
| KR | 102178701 B1 | * | 7/2004 | |
| KR | 20060008095 A | * | 3/2005 | |
| KR | 1020050112359 A | | 11/2005 | |
| KR | 2006100548 A | * | 9/2006 | ......... G03F 7/70608 |
| KR | 1020070044513 A | | 4/2007 | |
| KR | 1020170006570 A | | 1/2017 | |
| KR | 1020180134179 A | | 12/2018 | |
| KR | 102096954 B1 | | 4/2020 | |
| KR | 102204024 B1 | | 1/2021 | |
| KR | 1020210002196 A | | 1/2021 | |
| WO | WO202018997 A1 | * | 1/2020 | |

\* cited by examiner

SUBSTRATE PROCESSING CHAMBER, SUBSTRATE PROCESSING SYSTEM INCLUDING THE SAME, AND SUBSTRATE PROCESSING METHOD USING THE SAME

CROSS-REFERENCE TO RELATED APPLICATION

This application is based on and claims priority under 35 U.S.C. § 119 to Korean Patent Application No. 10-2021-0101884, filed on Aug. 3, 2021, in the Korean Intellectual Property Office, the disclosure of which is incorporated by reference herein in its entirety.

BACKGROUND

The present disclosure relates to a substrate processing chamber, a substrate processing system including the same, and a substrate processing method using the same, and in particular, to a substrate processing chamber, which is configured to precisely control a wetting amount, a substrate processing system including the same, and a substrate processing method using the same.

A process of fabricating a semiconductor device includes various processes. For example, the semiconductor device may be fabricated through a photolithography process, an etching process, a deposition process, and a plating process. A wetting process of supplying a liquid material (e.g., developing solution) on a wafer may be performed during the photolithography process. In addition, a drying process may be performed to remove the liquid material from the wafer. Various methods are used to form the liquid material on the wafer or to remove the liquid material from the wafer.

SUMMARY

Example embodiments provide a substrate processing chamber, which is configured to monitor a wetting amount, a substrate processing system including the same, and a substrate processing method using the same.

Example embodiments provide a substrate processing chamber, which is configured to precisely control a wetting amount, a substrate processing system including the same, and a substrate processing method using the same.

Example embodiments provide a substrate processing chamber, which is configured to efficiently perform a drying process, a substrate processing system including the same, and a substrate processing method using the same.

Example embodiments provide a substrate processing chamber, which is configured to prevent a defect from occurring on a substrate and thereby to increase a yield in a fabrication process, a substrate processing system including the same, and a substrate processing method using the same.

Example embodiments provide a substrate processing chamber, which is configured to reduce process time, a substrate processing system including the same, and a substrate processing method using the same.

According to an aspect of an example embodiment, a substrate processing chamber includes: a housing providing a process space; a spin apparatus provided in the housing; and a fluid spraying nozzle configured to spray fluid into the process space, wherein the spin apparatus includes: a spin chuck configured to support a substrate; a rotation driving part configured to rotate the spin chuck; and a weight sensor configured to measure a weight of the substrate supported on the spin chuck.

According to an aspect of example embodiment, a substrate processing system includes: a substrate processing chamber; a fluid supplying part configured to supply fluid into the substrate processing chamber; a drying chamber configured to dry a substrate transferred from the substrate processing chamber; a drying fluid supplying part configured to supply a drying fluid into the drying chamber; and a transfer unit configured to transfer the substrate from the substrate processing chamber to the drying chamber, wherein the substrate processing chamber includes: a housing providing a process space; a spin apparatus provided in the housing; and a fluid spraying nozzle configured to spray the fluid into the process space, and wherein the spin apparatus includes: a spin chuck configured to support and rotate the substrate; and a weight sensor configured to measure a weight of the substrate disposed on the spin chuck.

According to an aspect of an example embodiment, a substrate processing method includes: disposing a substrate on a spin chuck of a spin apparatus in a substrate processing chamber; spraying fluid onto a top surface of the substrate through a fluid spraying nozzle of the substrate processing chamber; rotating the substrate using the spin apparatus; and measuring a weight of the substrate, on which the fluid is sprayed, using a weight sensor of the spin apparatus.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
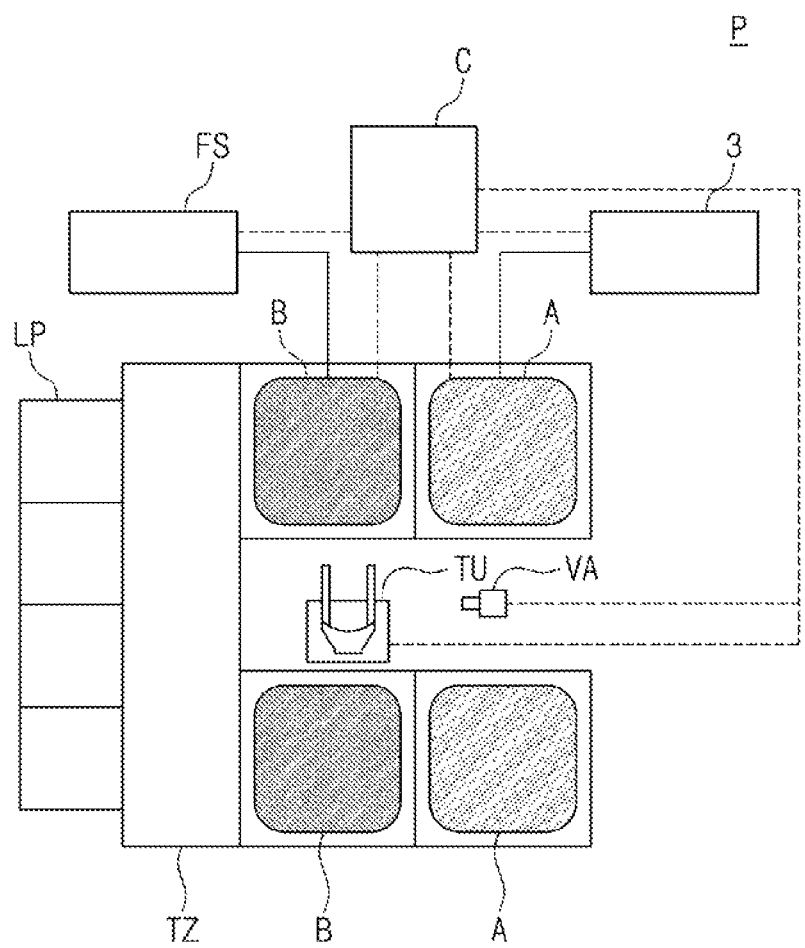
FIG. 1 is a schematic diagram illustrating a substrate processing system according to an example embodiment.

Example embodiments of the present disclosure will now be described more fully with reference to the accompanying drawings, in which example embodiments are shown. Like reference numerals in the drawings denote like elements, and thus their description will be omitted.

FIG. 1 is a schematic diagram illustrating a substrate processing system according to an example embodiment.

Referring to FIG. 1, a substrate processing system P may be provided. The substrate processing system P may be a system, which is used to process a substrate during a semiconductor fabrication process. More specifically, the substrate processing system P may be a system, which performs a wetting process or a drying process on the substrate. For example, the substrate processing system P may be used to spray a liquid material on the substrate or perform a wet process on the substrate or to remove a liquid material from a top surface of the substrate or dry the substrate. In the specification, the term 'substrate' may mean a semiconductor wafer. The wafer may be a silicon wafer, but embodiments are not limited to this example. The substrate processing system P may include a loading port LP, a transfer region TZ, a substrate processing chamber B, a fluid supplying part FS, a transfer unit TU, an imaging device VA, a drying chamber A, a drying fluid supplying part 3, and a controller C.

The loading port LP may be a port, on which the substrate is loaded. For example, a wafer, on which various semiconductor fabrication processes are performed, may be loaded on the loading port LP. In an example embodiment, a plurality of the loading ports LP may be provided. A plurality of substrates may be loaded on each of the loading ports LP. However, in order to reduce complexity in the description, one of the loading ports LP will be described as an example.

The transfer region TZ may be a region, which is used to move a substrate loaded on the loading port LP. For example, the transfer unit TU may be used to move a wafer, which is loaded on the loading port LP, to the substrate processing chamber B and/or the drying chamber A. The transfer region TZ may be provided to face or span a plurality of the loading ports LP.

The substrate processing chamber B may be used to perform a wet process on the substrate. In other words, the substrate processing chamber B may be a wet chamber. If a wafer is placed in the substrate processing chamber B, various liquid materials (e.g., chemicals and/or isopropyl alcohol (IPA)) may be applied to or provided on the wafer. The providing of the liquid material may be performed in various manners. In an example embodiment, a plurality of the substrate processing chambers B may be provided. For example, a pair of the substrate processing chambers B may be provided. The pair of the substrate processing chambers B may be disposed to face each other. However, in order to reduce complexity in the description, one of the substrate processing chambers B will be described as an example. The substrate processing chamber B will be described in more detail with reference to FIG. 2.

The fluid supplying part FS may be configured to supply fluid into the substrate processing chamber B. More specifically, the fluid supplying part FS may be configured to store and supply various chemicals and/or IPA, which will be sprayed into the substrate processing chamber B. For this, the fluid supplying part FS may include a fluid tank, a pump, and so forth.

The transfer unit TU may be configured to transfer a substrate. For example, the transfer unit TU may be used to transfer a wafer, which is loaded on the loading port LP, to the substrate processing chamber B through the transfer region TZ. In addition, the transfer unit TU may be used to unload the wafer from the substrate processing chamber B and to transfer the wafer to the drying chamber A. For this, the transfer unit TU may include an actuator (e.g., a motor). Although FIG. 1 illustrates an example in which just one transfer unit TU is provided, embodiments are not limited to this example.

The imaging device VA may be configured to obtain an image of the substrate disposed on the transfer unit TU. More specifically, the imaging device VA may be configured to obtain an image of a top surface of the substrate on the transfer unit TU and to transmit information about the image to the controller C. For this, the imaging device VA may include a camera or the like. This will be described in more detail below.

The drying chamber A may be configured to perform a drying process on a substrate. For example, the drying chamber A may be used to dry a wafer, which is unloaded from the substrate processing chamber B. In other words, the drying chamber A may be used to remove a liquid material from a wafer, which is unloaded from the substrate processing chamber B and is coated with the IPA or the like. The drying chamber A may be placed near the substrate processing chamber B. For example, the drying chamber A may be placed right next to the substrate processing chamber B. In this case, the wafer may be quickly transferred from the substrate processing chamber B to the drying chamber A by the transfer unit TU. In an example embodiment, a plurality of the drying chambers A may be provided. For example, a pair of the drying chambers A may be provided. The pair of the drying chambers A may be disposed to face each other. However, in the following description, the drying chamber A will be referred to as a singular element, for brevity's sake. The drying chamber A will be described in more detail with reference to FIG. 4.

The drying fluid supplying part 3 may be configured to supply fluid into the drying chamber A. More specifically, the drying fluid supplying part 3 may supply a drying fluid, which will be sprayed into the drying chamber A. The drying fluid, which is sprayed by the drying fluid supplying part 3, may be carbon dioxide ($CO_2$). The carbon dioxide ($CO_2$), which is sprayed into the drying chamber A, may be in a supercritical fluid (SCF) state. The drying fluid supplying part 3 will be described in more detail with reference to FIG. 5.

The controller C may be configured to control the substrate processing chamber B, the drying chamber A, the fluid supplying part FS, the drying fluid supplying part 3, the transfer unit TU, and/or the imaging device VA. For example, in order to adjust a wetting amount of the substrate, the controller C may be configured to control the substrate processing chamber B and the fluid supplying part FS. The controller C may be a processor and a memory storing instructions executed by the processor. This will be described in more detail below.

Figure 2:
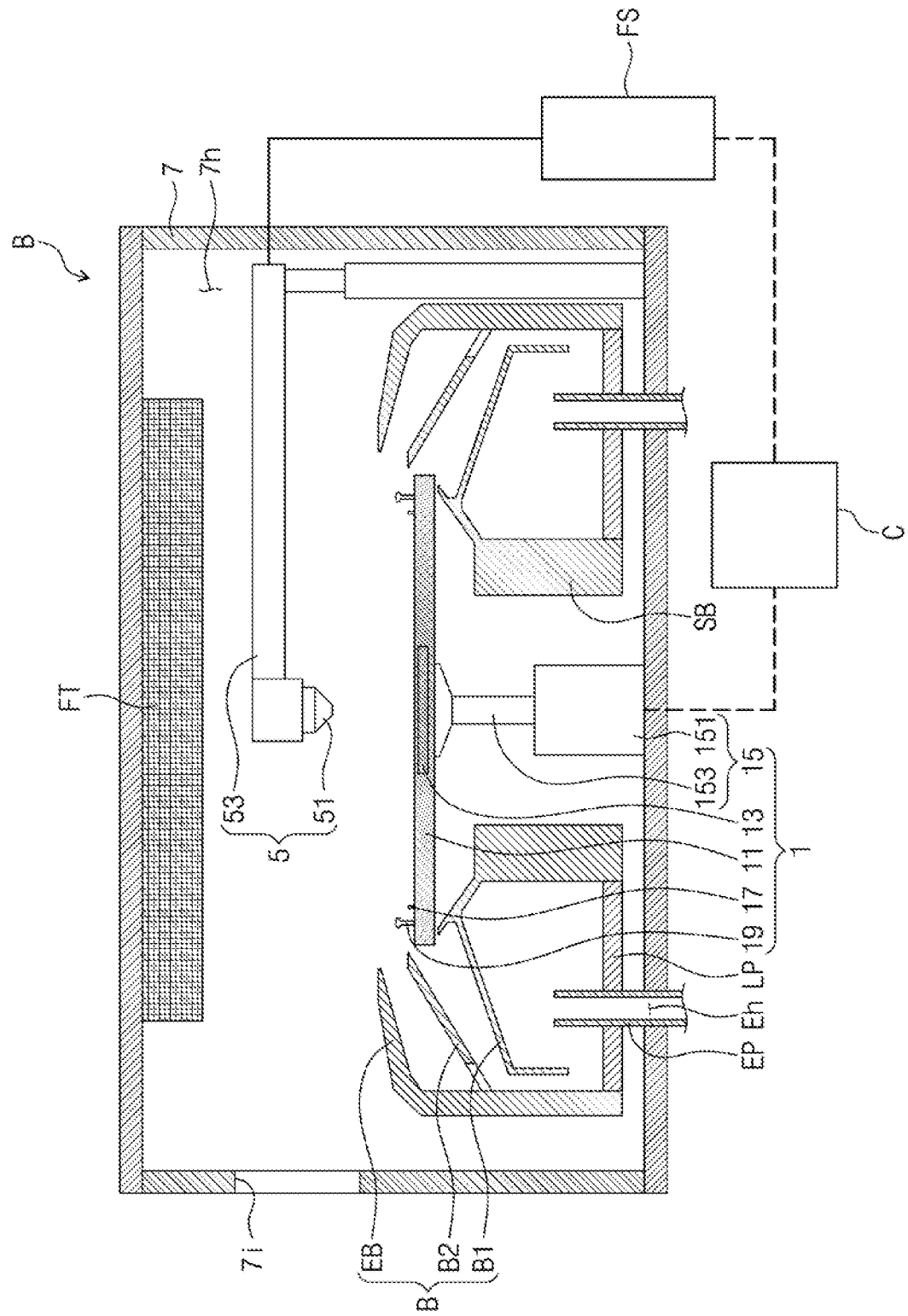
FIG. 2 is a sectional view illustrating a substrate processing chamber according to an example embodiment.

FIG. 2 is a sectional view illustrating a substrate processing chamber according to an example embodiment.

Referring to FIG. 2, the substrate processing chamber B may include a housing 7, a spin apparatus 1, a fluid spraying part 5, a filter FT, a bowl B, an exhaust part EP, a supporting member SB, and a lower supporting plate LP.

The housing 7 may be provided to have a process space 7h. The spin apparatus 1, the fluid spraying part 5, and the bowl B may be disposed in the process space 7h. A wetting process may be performed on the substrate in the housing 7. The housing 7 may be provided to further have an injection hole 7i. The injection hole 7i may be used to connect the process space 7h to an external space. The substrate or the like may be loaded in the process space 7h through the injection hole 7i. For example, the transfer unit TU (e.g., of FIG. 1) may be used to place the substrate on the spin apparatus 1 through the injection hole 7i.

The spin apparatus 1 may be positioned in the housing 7. The spin apparatus 1 may be configured to rotate the substrate. The spin apparatus 1 may include a spin chuck 11, a weight sensor 13, a rotation driving part 15, a supporting pin 17, and a fastening pin 19.

The spin chuck 11 may be provided in the form of a plate. More specifically, the spin chuck 11 may be shaped like a plate whose area is larger than that of the substrate. The substrate may be disposed on the spin chuck 11. The spin chuck 11 may be configured to support the substrate. The spin chuck 11 may be rotated by the rotation driving part 15. Thus, the substrate on the spin chuck 11 may be rotated. The spin chuck 11 may include polytetrafluoroethylene (e.g., TEFLON), but embodiments are not limited to this example.

The weight sensor 13 may be configured to measure a weight of the substrate disposed on the spin chuck 11. More specifically, the weight sensor 13 may be configured to measure the weight of the substrate, which is supported by the supporting pin 17. The weight sensor 13 may be coupled to the spin chuck 11. For example, the weight sensor 13 may be buried in the spin chuck 11. In the case where the weight sensor 13 is buried in the spin chuck 11, it may be possible to prevent the weight sensor 13 from being contaminated. More specifically, it may be possible to prevent the weight sensor 13 from being damaged by various chemicals sprayed into the process space 7h. However, embodiments are not limited to this example, and the weight sensor 13 may be connected to other portion of the spin chuck 11, as long as it can be used to measure the weight of the substrate disposed on the supporting pin 17. The weight sensor 13 may include an element, which is configured to measure the weight of the substrate. For example, the weight sensor 13 may include a load cell or the like. The weight sensor 13 may be connected to the controller C. More specifically, the weight sensor 13 may be connected to the controller C in a wired or wireless manner. Information about the weight of the substrate measured by the weight sensor 13 may be transmitted to the controller C.

The rotation driving part 15 may be configured to rotate the spin chuck 11. The rotation driving part 15 may include a rotation driver 151 and a rotation axis 153. The rotation driver 151 may be configured to rotate the rotation axis 153. For this, the rotation driver 151 may include a motor or the like. However, embodiments are not limited to this example, and the rotation driver 151 may include an element which is configured to deliver a rotation power provided from the outside. The rotation axis 153 may be coupled to the rotation driver 151. The rotation axis 153 may be vertically extended. The rotation axis 153 may be connected to the spin chuck 11. The spin chuck 11 may be rotated by the rotation axis 153.

The supporting pin 17 may be configured to support the substrate. The supporting pin 17 may be placed on the spin chuck 11. The supporting pin 17 may have a shape upwardly extending from the spin chuck 11. In an example embodiment, a plurality of the supporting pins 17 may be provided. The supporting pins 17 may be spaced apart from each other along a circumference of the spin chuck 11. The substrate may be supported by the supporting pins 17. In other words, the substrate may be placed on the supporting pins 17 to be vertically spaced apart from the top surface of the spin chuck 11 by a specific distance. However, in order to reduce complexity in the description, one of the supporting pins 17 will be described as an example.

The fastening pin 19 may be placed on the spin chuck 11. The fastening pin 19 may be placed outside the supporting pin 17 (e.g., radially outward with respect to a center of the spin chuck 11). The fastening pin 19 may be configured to fasten the substrate disposed on the supporting pin 17. That is, if the substrate is disposed on the supporting pin 17, the fastening pin 19 may press an outer portion of the substrate, and thus, the substrate on the supporting pin 17 may be stably fastened by the fastening pin 19. In an example embodiment, a plurality of the fastening pins 19 may be provided but, in order to reduce complexity in the description, one of the fastening pins 19 will be described as an example.

The fluid spraying part 5 may be placed in the process space 7h. The fluid spraying part 5 may be configured to spray fluid into the process space 7h. More specifically, the fluid spraying part 5 may be used to spray the fluid onto the top surface of the substrate on the spin apparatus 1. The fluid spraying part 5 may include a fluid spraying nozzle 51 and a fluid connecting portion 53. The fluid spraying nozzle 51 may be disposed to face the top surface of the spin chuck 11. The fluid may be sprayed toward the spin chuck 11 through the fluid spraying nozzle 51. The fluid connecting portion 53 may be configured to connect the fluid supplying part FS to the fluid spraying nozzle 51. Fluid in the fluid supplying part FS may be sprayed onto the substrate through the fluid connecting portion 53 and the fluid spraying nozzle 51. A plurality of the fluid spraying parts 5 may be provided. The fluid spraying parts 5 may be used to spray different kinds of fluid materials. Some of the fluid spraying parts 5 may be configured to spray various chemicals onto the substrate. For example, at least one of the fluid spraying parts 5 may be used to spray developing solution or the like. Other of the fluid spraying parts 5 may be used to spray cleaning liquid onto the substrate. For example, at least one of the fluid spraying parts 5 may be configured to spray isopropyl alcohol (IPA) toward the substrate. However, in order to reduce complexity in the description, one of the fluid spraying parts 5 will be described as an example.

The filter FT may be placed at an upper portion of the process space 7h. For example, the filter FT may be coupled to a bottom surface of a top portion of the housing 7. The filter FT may be configured to absorb a contamination material (e.g., particles or dust) in the process space 7h.

The bowl B may be placed outside (e.g., around) the spin apparatus 1. More specifically, the bowl B may be spaced apart outward from the spin apparatus 1 and may be provided to enclose the spin apparatus 1. Thus, the spin apparatus 1 may be placed in the bowl B. The bowl B may have a circular shape. In other words, the bowl B may have a ring shape. However, embodiments are not limited to this example. The bowl B may include a first bowl B1, a second bowl B2, and an outer bowl EB. The first bowl B1 may be located at a level that is lower than the substrate loaded on the spin chuck 11. The first bowl B1 may be supported by the supporting member SB. The second bowl B2 may be spaced apart outward from the first bowl B1. The second bowl B2 may be provided to enclose the first bowl B1. A bottom surface of the second bowl B2 may face a top surface of the first bowl B1. The outer bowl EB may be disposed outside the second bowl B2 to enclose the second bowl B2.

The supporting member SB may be placed outside the rotation axis 153. The supporting member SB may be used to support the bowl B. The lower supporting plate LP may be connected to the supporting member SB. The exhaust part EP may be provided to penetrate the lower supporting plate LP. The exhaust part EP may be provided to have an exhaust path Eh. The exhaust path Eh may be connected to the process space 7h. The fluid (e.g., chemicals and IPA) may be discharged to the outside of the housing 7 through the exhaust path Eh.

Figure 3:
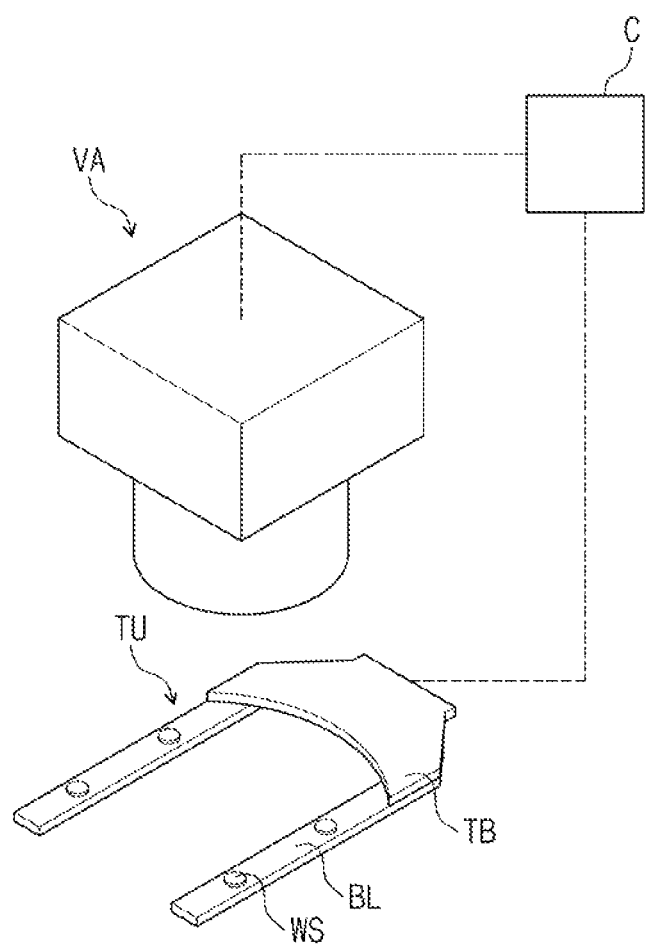
FIG. 3 is a perspective view illustrating a transfer unit according to an example embodiment.

FIG. 3 is a perspective view illustrating a transfer unit according to an example embodiment.

Referring to FIG. 3, the transfer unit TU may include a transfer body TB, a supporting blade BL, and a second weight sensor WS (e.g., a second weight sensor). The transfer body TB may be configured to support the supporting blade BL. The supporting blade BL may be horizontally extended from the transfer body TB. The substrate may be disposed on the supporting blade BL. That is, the substrate may be supported by the supporting blade BL. In an example embodiment, a plurality of the supporting blades BL may be provided. For example, a pair of the supporting blades BL may be provided. The pair of the supporting blades BL may be spaced apart from each other. However, in order to reduce complexity in the description, one of the supporting blades BL will be described as an example.

The second weight sensor WS may be connected to the supporting blade BL. For example, the second weight sensor WS may be buried in the supporting blade BL. The second weight sensor WS may be configured to measure the weight of the substrate disposed on the supporting blade BL. For this, the second weight sensor WS may include a load cell or the like. In addition, the second weight sensor WS may be configured to transmit information about the measured weight of the substrate to the controller C. In an example embodiment, a plurality of the second weight sensors WS may be provided. For example, four second weight sensors WS may be provided. In the case where a pair of the supporting blades BL are provided, a pair of the second weight sensors WS may be provided on each of the supporting blades BL. However, in order to reduce complexity in the description, one of the second weight sensors WS will be described as an example.

The imaging device VA may be configured to obtain an image of a substrate, which is transferred by the transfer unit TU. More specifically, the imaging device VA may be used to obtain an image of the top surface of the substrate disposed on the supporting blade BL. The imaging device VA may be connected to the controller C. In addition, the imaging device VA may be configured to transmit image information about the top surface of the substrate to the controller C.

Figure 4:
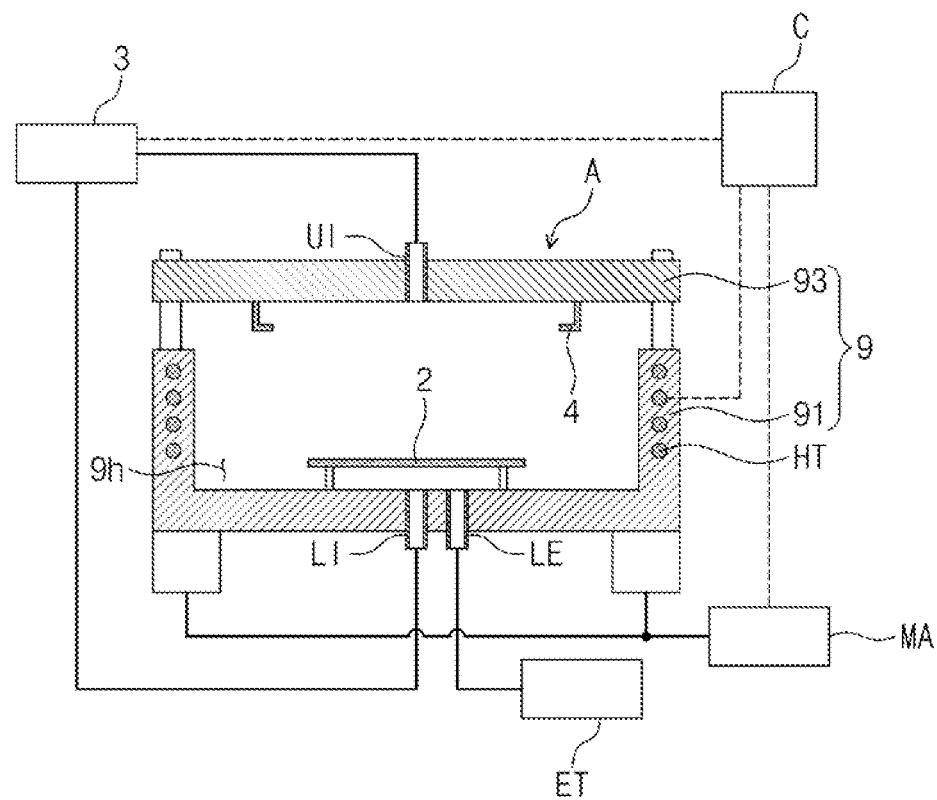
FIG. 4 is a sectional view illustrating a drying chamber according to an example embodiment.

FIG. 4 is a sectional view illustrating a drying chamber according to an example embodiment.

Referring to FIG. 4, the drying chamber A may be configured to dry a substrate. More specifically, the drying chamber A may be used to remove liquid from a top surface of the substrate. The substrate, which is unloaded from the substrate processing chamber B (e.g., see FIG. 2) and is in a wet state, may be dried in the drying chamber A. In an example embodiment, the drying chamber A may include a drying housing 9, a drying heater HT, a drying chuck 4, a blocking plate 2, a chamber driving part MA, and an exhaust tank ET.

The drying housing 9 may be configured to have a drying space $9h$. The drying housing 9 may include a lower chamber 91 and an upper chamber 93. The lower chamber 91 may be spaced apart downward from the upper chamber 93. The drying space $9h$ may be provided between the lower and upper chambers 91 and 93. The lower chamber 91 may be configured to be movable in upward and downward directions. For example, the lower chamber 91 may be moved in the upward direction by the chamber driving part MA and may be coupled to the upper chamber 93. In the case where the lower and upper chambers 91 and 93 are coupled to each other, the drying space $9h$ may be isolated from the outside. An upper injection hole UI may be provided in the upper chamber 93. The upper injection hole UI may be connected to the drying fluid supplying part 3. A drying fluid may be supplied from the drying fluid supplying part 3 into the drying space $9h$ through the upper injection hole UI. A lower injection hole LI and a lower exhausting hole LE may be provided in the lower chamber 91. The lower injection hole LI may be connected to the drying fluid supplying part 3. The drying fluid may be supplied from the drying fluid supplying part 3 into the drying space $9h$ through the lower injection hole LI. The lower exhausting hole LE may be connected to the exhaust tank ET. The drying fluid may be discharged to the outside through the lower exhausting hole LE.

The drying heater HT may be coupled to the drying housing 9. The drying heater HT may be used to heat the drying space $9h$. Due to the heating process by the drying heater HT, the drying fluid, which is supplied into the drying space $9h$, may be maintained to its supercritical state.

The drying chuck 4 may be connected to the upper chamber 93. The drying chuck 4 may be spaced apart downward from the upper chamber 93. The substrate may be disposed on the drying chuck 4. That is, the drying chuck 4 may be provided to support the substrate.

The blocking plate 2 may be connected to the lower chamber 91. The blocking plate 2 may be spaced apart upward from the lower injection hole LI and the lower exhausting hole LE by a specific distance. The blocking plate 2 may be configured to impede the flow of the drying fluid. For example, the blocking plate 2 may prevent the drying fluid, which is supplied through the lower injection hole LI, from being directly sprayed onto the substrate on the drying chuck 4. The chamber driving part MA may be connected to the lower chamber 91. The chamber driving part MA may be configured to move the lower chamber 91 in upward and downward directions. The lower chamber 91 may be coupled to or separated from the upper chamber 93 by the chamber driving part MA. For this, the chamber driving part MA may include an actuator, such as a motor. The exhaust tank ET may be connected to the lower exhausting hole LE. The drying fluid, which is discharged through the lower exhausting hole LE, may be moved into the exhaust tank ET.

Figure 5:
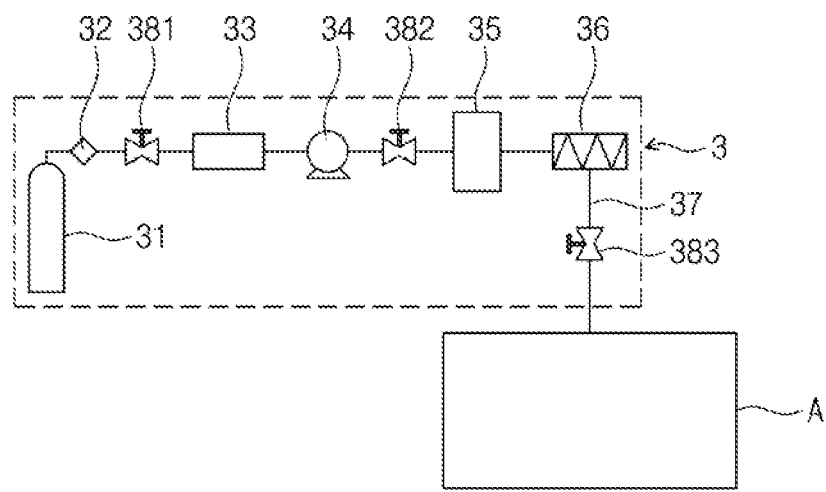
FIG. 5 is a schematic diagram illustrating a drying fluid supplying part according to an example embodiment.

FIG. 5 is a schematic diagram illustrating a drying fluid supplying part according to an example embodiment.

Referring to FIG. 5, the drying fluid supplying part 3 may include a drying fluid supplying source 31, a drying fluid line 37, a filter 32, a first valve 381, a condenser 33, a pump 34, a second valve 382, a tank 35, a heater 36, and a third valve 383.

The drying fluid supplying source 31 may be used to supply the drying fluid. More specifically, the drying fluid supplying source 31 may be configured to store and supply a gaseous fluid, which will be transformed to a supercritical fluid. In the case where the drying fluid is supercritical carbon dioxide ($CO_2$), the drying fluid supplying source 31 may be configured to store gaseous carbon dioxide. Temperature of the carbon dioxide gas, which is supplied by the drying fluid supplying source 31 may range from about 10° C. to 30° C. In addition, pressure of the carbon dioxide gas supplied by the drying fluid supplying source 31 may range from about 4 MPa to 6 MPa. The drying fluid supplied from the drying fluid supplying source 31 may flow through the drying fluid line 37.

The drying fluid line 37 may be used as a path for supplying the drying fluid from the drying fluid supplying source 31 to the drying chamber A. The filter 32 may be placed on the drying fluid line 37. The filter 32 may be configured to remove a contamination material in the drying fluid. The first valve 381 may be configured to open or close a conduit between the filter 32 and the condenser 33 and thereby to control the flow of the drying fluid.

The condenser 33 may be configured to cool the carbon dioxide gas, which is supplied from the drying fluid supplying source 31. For example, the carbon dioxide gas may be liquefied by the condenser 33. For example, the temperature of the carbon dioxide liquefied by the condenser 33 may range from about 0° C. to 6° C. In addition, the pressure of the carbon dioxide liquefied by the condenser 33 may range from about 4 MPa to 6 MPa.

The pump 34 may be configured to increase the pressure of the drying fluid liquefied by the condenser 33. For example, the pressure of the carbon dioxide liquefied by the condenser 33 may be increased to a range from about 15 MPa to 25 MPa by the pump 34. In addition, the carbon dioxide passing through the pump 34 may have a temperature of about 15° C. to 25° C. The second valve 382 may be configured to open or close a conduit between the pump 34 and the tank 35 and thereby to control the flow of the drying fluid. The tank 35 may be configured to store the drying fluid compressed by the pump 34.

The heater 36 may be configured to heat the drying fluid flowing through the drying fluid line 37. More specifically, the heater 36 may be used to heat the liquefied carbon dioxide, which is compressed by the pump 34. As a result of this heating process, the liquefied carbon dioxide may become a supercritical state. The carbon dioxide, which is heated by the heater 36 and is in a supercritical state, may be in a high-temperature high-pressure state. For example, the carbon dioxide, which is in the supercritical state by the heater 36, may have a temperature of about 60° C. to 90° C. In addition, the carbon dioxide, which is in the supercritical state by the heater 36, may have pressure of about 15 MPa to 25 MPa. The third valve 383 may be configured to control the flow of the carbon dioxide, which is in the supercritical state by the heater 36. The carbon dioxide in the supercritical state may be supplied into the drying chamber A through the third valve 383.

Figure 6:
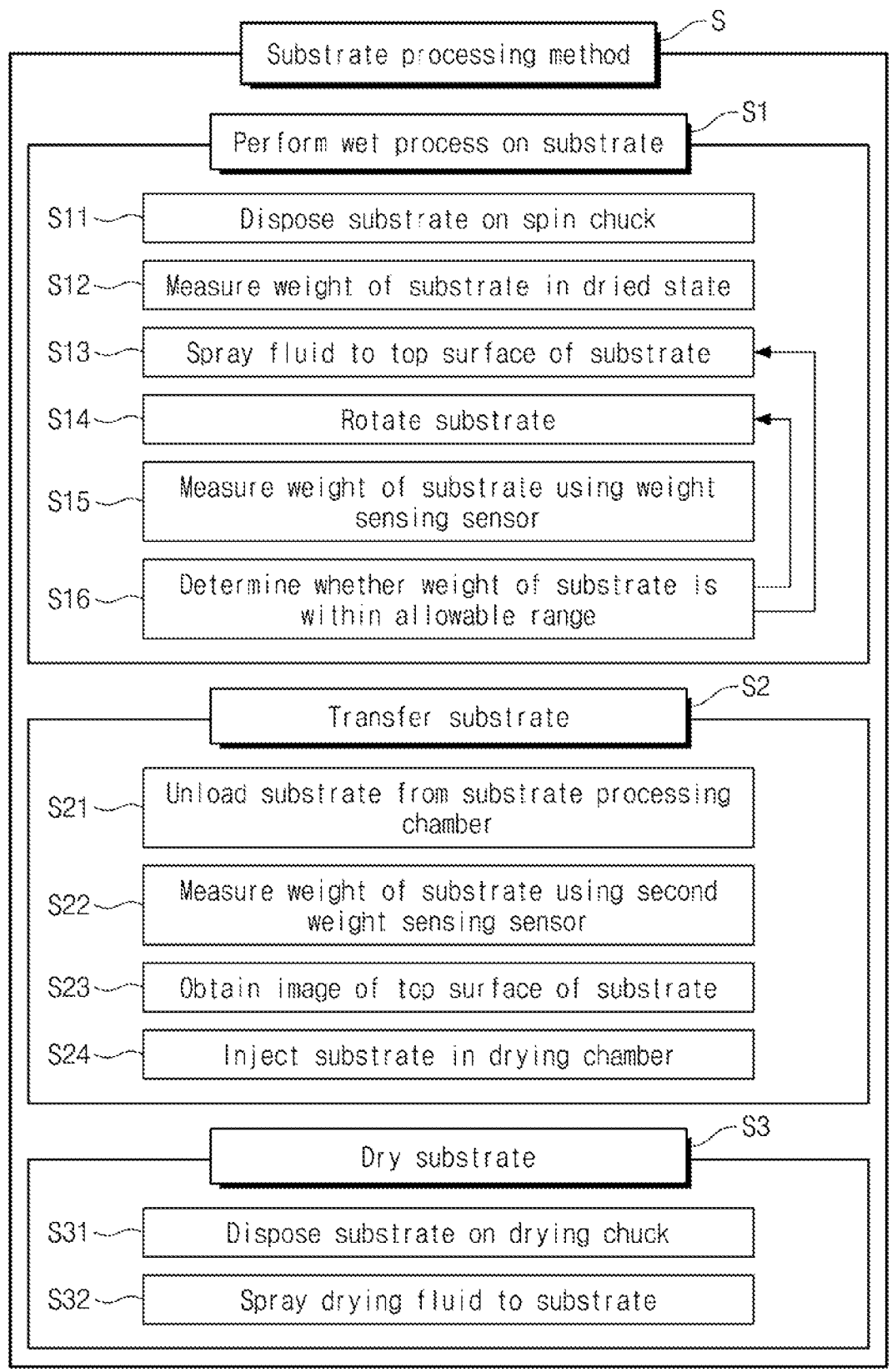
FIG. 6 is a flow chart illustrating a substrate processing method according to an example embodiment.

FIG. 6 is a flow chart illustrating a substrate processing method according to an example embodiment.

Referring to FIG. 6, a substrate processing method S may be provided. The substrate processing method S may be used to process a substrate using the substrate processing system P (e.g., see FIG. 1) described with reference to FIG. 1. More specifically, the substrate processing method S may include performing a wet process on the substrate and drying the substrate. For this, the substrate processing method S may include performing a wet process on a substrate (in S1), transferring the substrate (in S2), and drying the substrate (in S3).

The wet process on the substrate (in S1) may be a process of spraying fluid onto the substrate using the substrate processing chamber B (e.g., see FIG. 2). The wet process on the substrate (in S1) may include disposing the substrate on a spin chuck (in S11), measuring a weight of the substrate in a dried state (in S12), spraying fluid onto a top surface of the substrate (in S13), rotating the substrate (in S14), measuring a weight of the substrate using a weight sensor (in S15), and determining whether the weight of the substrate is within an allowable range (in S16).

The transferring of the substrate (in S2) may be a process of unloading the substrate from the substrate processing chamber B (e.g., see FIG. 2) and inserting the substrate into the drying chamber A (e.g., see FIG. 4). The transferring of the substrate (in S2) may include unloading the substrate from the substrate processing chamber (in S21), measuring a weight of the substrate using a second weight sensor (in S22), obtaining an image of the top surface of the substrate (in S23), and injecting the substrate into the drying chamber A (in S24).

The drying of the substrate (in S3) may be a process of drying the substrate using the drying chamber A (e.g., see FIG. 4). The drying of the substrate (in S3) may include disposing the substrate on the drying chuck (in S31) and spraying a drying fluid onto the substrate (in S32).

Hereinafter, each step of the substrate processing method S of FIG. 6 will be described in more detail with reference to FIGS. 7 to 17.

FIGS. 7 to 17 are diagrams sequentially illustrating a process of processing a substrate according to the flow chart of FIG. 6.

Figure 7:
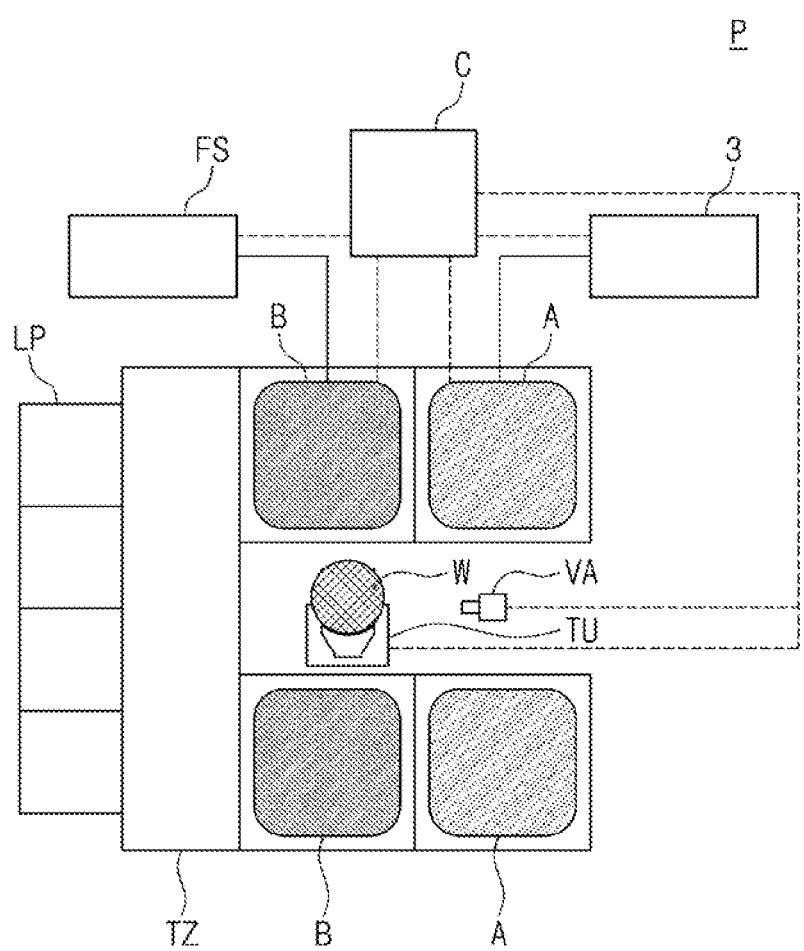
FIGS. 7 to 17 are diagrams sequentially illustrating a process of processing a substrate according to the flow chart of FIG. 6.

Referring to FIG. 7, the transfer unit TU may be configured to transfer a substrate W. More specifically, the transfer unit TU may be used to insert the substrate W into the substrate processing chamber B.

Figure 8:
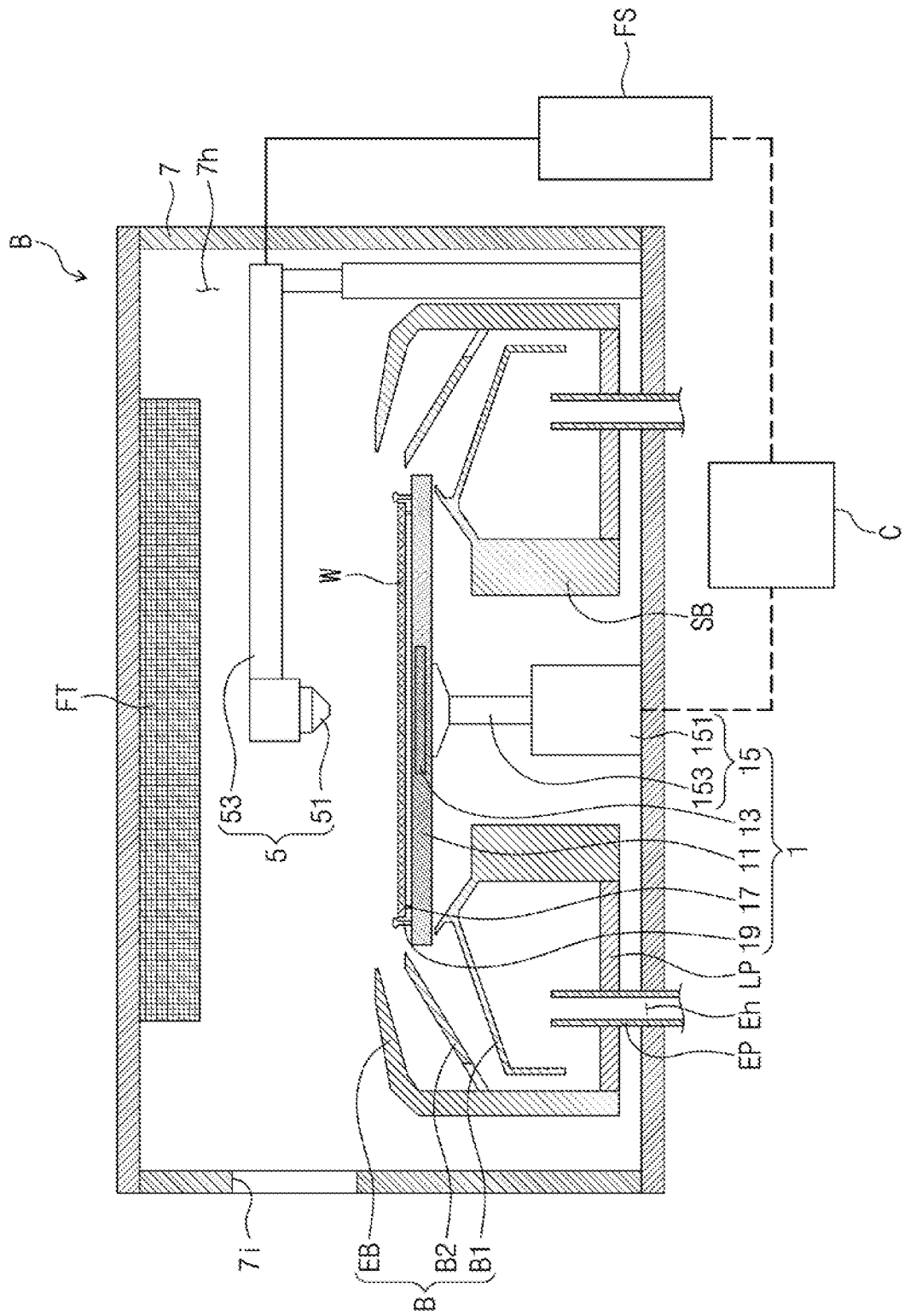

Referring to FIGS. 8 and 6, the disposing of the substrate on the spin chuck (in S11) may include disposing the substrate W on the spin apparatus 1 using the transfer unit TU (e.g., see FIG. 7). More specifically, the substrate W may be placed on the supporting pin 17. The supporting pin 17 may be configured to support the substrate W and to separate the substrate W from the spin chuck 11 by a specific distance in an upward direction. The substrate W may be fastened by the fastening pin 19. For this, the fastening pin 19 may be configured to be movable. The fastening pin 19 may be inwardly moved toward the substrate W to fasten the substrate W to a specific position.

The measuring of the weight of the substrate in the dried state (in S12) may include measuring the weight of the substrate W using the weight sensor 13. When the substrate W is inserted into the substrate processing chamber B, the substrate W may be in a dried state. In other words, there may be no liquid material on the substrate W. The weight sensor 13 may measure a weight of the substrate W supported by the supporting pin 17. The weight measured through this process may be a weight of the dried substrate W. The weight sensor 13 may be configured to transmit information about the weight of the dried substrate W to the controller C. The controller C may store the information about the weight of the dried substrate W.

Figure 9:
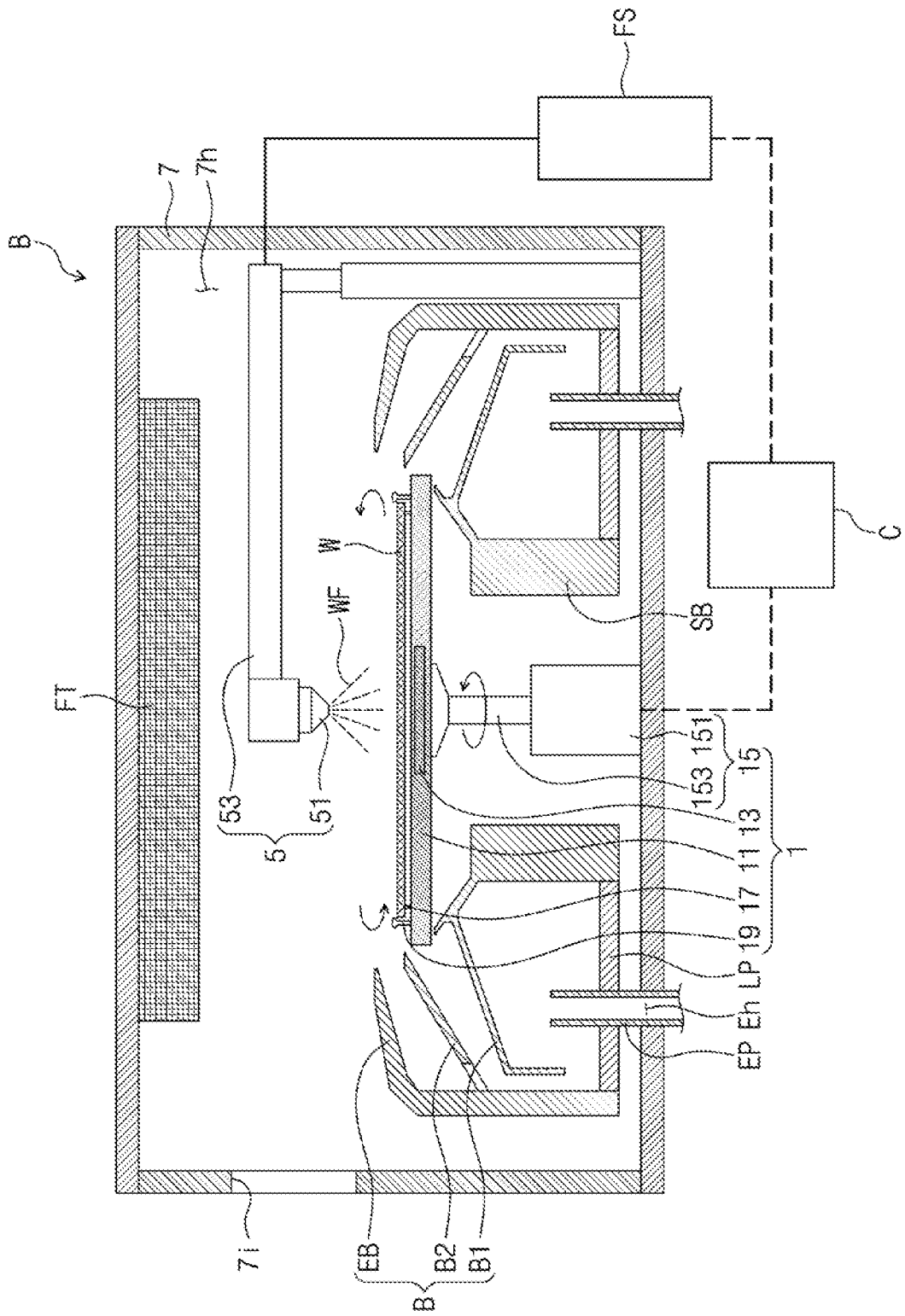

Referring to FIGS. 9 and 6, the spraying of the fluid onto the top surface of the substrate (in S13) may include spraying fluid WF onto the top surface of the substrate W using the fluid spraying nozzle 51. In an example embodiment, a plurality of the fluid spraying nozzles 51 may be provided, as described above. The fluid spraying nozzles 51 may be used to sequentially spray various kinds of fluids WF onto the top surface of the substrate W. In the last step, a cleaning liquid may be sprayed onto the top surface of the substrate W. For example, IPA, which is supplied from the fluid supplying part FS, may be sprayed onto the top surface of the substrate W through the fluid spraying nozzle 51.

The rotating of the substrate (in S14) may include rotating the substrate W using the spin apparatus 1. For example, if the spin chuck 11 is rotated by the rotation driving part 15, the substrate W, which is loaded on the spin chuck 11 and is fastened by the fastening pin 19, may be rotated. The substrate W may be rotated about an axis parallel to a vertical direction. In the case where the substrate W is rotated after or during the step of spraying the fluid onto the substrate W, the fluid may be spread out on the top surface of the substrate W. In other words, the fluid on the substrate W may be radially spread out by the rotation of the substrate W to uniformly cover the top surface of the substrate W.

Figure 10:
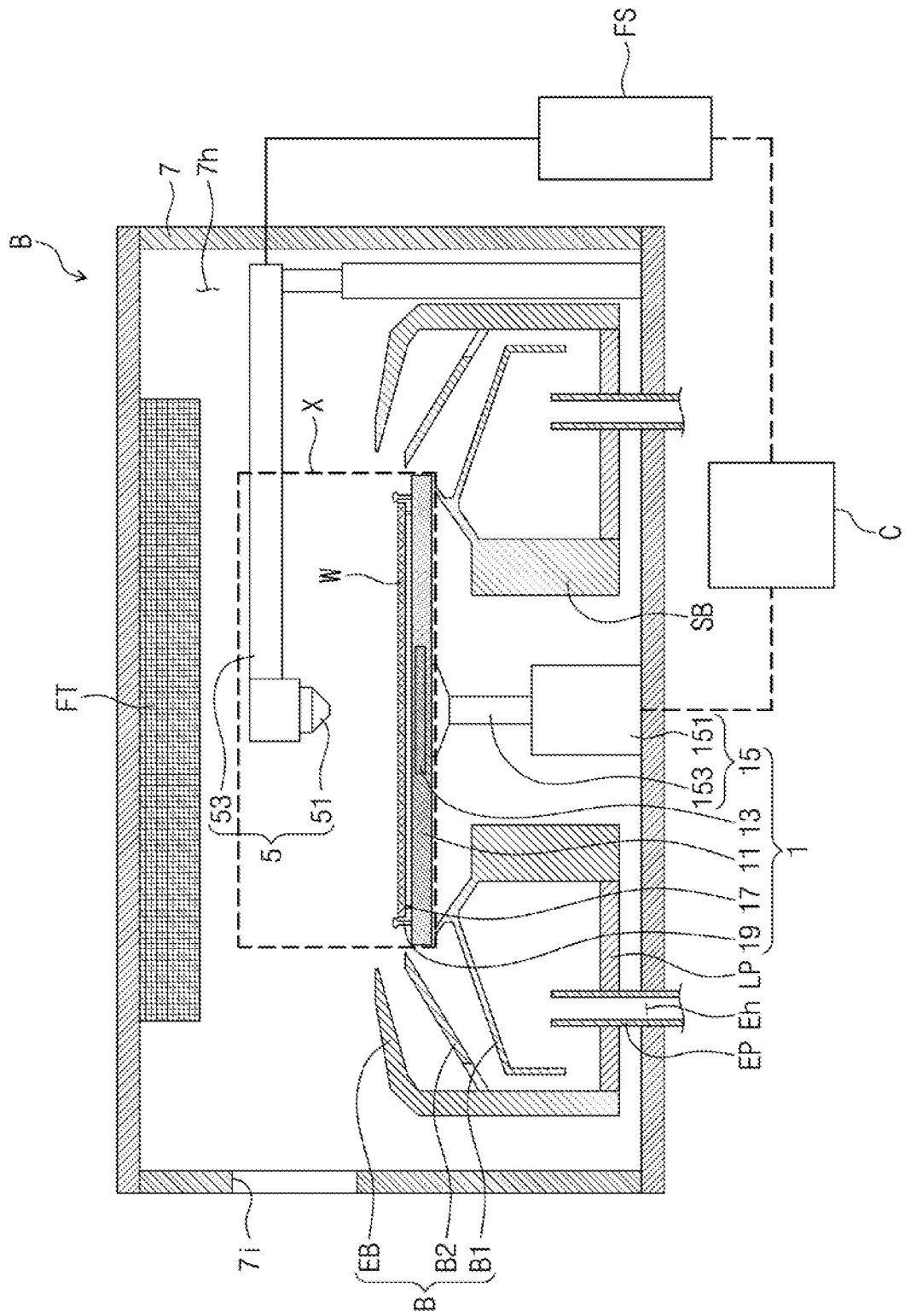
Figure 11:
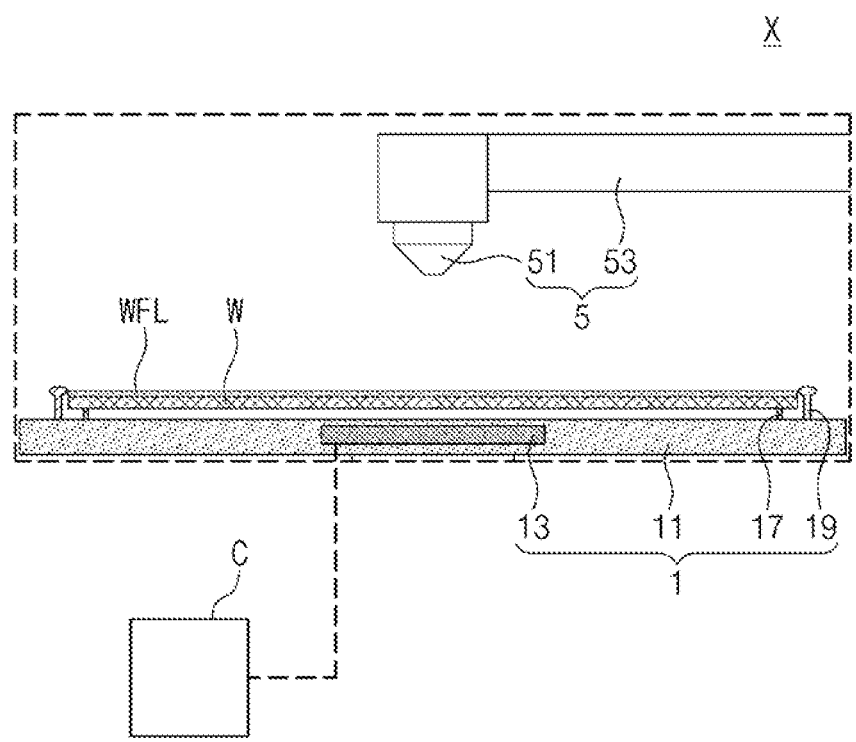

Referring to FIGS. 10, 11, and 6, the measuring of the weight of the substrate using the weight sensor (in S15) may include measuring the weight of the substrate W on the supporting pin 17 using the weight sensor 13. At this point in time, the sprayed fluid may be present on the substrate W. For example, there may be the fluid WFL left on the substrate W. In other words, the substrate W may be in a wet state. The fluid WFL on the substrate W may be provided in the form of a layer, but embodiments are not limited to this example. Thus, the weight measured by the weight sensor 13 may be a sum of the weight of the substrate W and the weight of the fluid WFL. The weight sensor 13 may transmit information about the measured weight to the controller C.

The step of determining whether the weight of the substrate is within an allowable range (in S16) may include determining whether the current amount of the fluid WFL on the substrate W is within the allowable range, based on the weight information obtained in the step S15. For example, by comparing the weight information obtained in the step S12 with the weight information obtained in the step S15, the controller C may calculate information about the amount of the fluid WFL. Alternatively, information about the amount of the fluid WFL may be calculated by comparing previously-input information about the weight of the substrate W with the weight information obtained in the step S15 using the weight sensor. The controller C may determine whether the amount of the fluid WFL is within an appropriate range. For example, information about the appropriate weight of the fluid WFL for each substrate may be previously input in the controller C. The controller C may determine whether a subsequent process is required, based on the weight of the fluid WFL.

For example, in the case where the weight of the substrate W and the amount of the fluid WFL are determined to be within their appropriate ranges, the substrate W may be unloaded from the substrate processing chamber B under control of the controller C. Thereafter, the substrate W may be inserted in the drying chamber A (e.g., see FIG. 14) by the transfer unit TU (e.g., see FIG. 12).

Alternatively, in the case where the weight of the substrate W and the amount of the fluid WFL are determined to be beyond their appropriate ranges, the step of spraying the fluid onto the top surface of the substrate (in S13) and/or the step of rotating the substrate (in S14) may be performed again under control of the controller C.

For example, if the amount of the fluid WFL formed on the substrate W is determined to be too low, the fluid supplying part FS may be controlled by the controller C to perform the step of spraying the fluid through the fluid spraying nozzle 51 again.

Alternatively, if the amount of the fluid WFL formed on the substrate W is determined to be excessive, the spin apparatus 1 may be controlled by the controller C to rotate the substrate W again. That is, while the substrate W is loaded on the spin apparatus 1, the substrate W may be rotated again under control of the controller C. A rotation speed and/or a rotation number of the spin chuck 11 may be controlled by the controller C to control the amount of the fluid WFL on the substrate W. For example, if the rotation speed of the spin chuck 11 is increased by the controller C, the amount of the fluid WFL on the substrate W may be reduced.

The afore-described steps may be repeated under control of the controller C, until the weight measured by the weight sensor 13 is determined to be within the appropriate range. The appropriate range for the amount of the fluid WFL on the substrate W may be determined in consideration of a drying process. More specifically, the appropriate range for the amount of the fluid WFL may be determined in consideration of an amount of the fluid WFL that can be completely removed from the substrate W by the drying fluid supplied into the drying chamber A (e.g., see FIG. 14).

Figure 12:
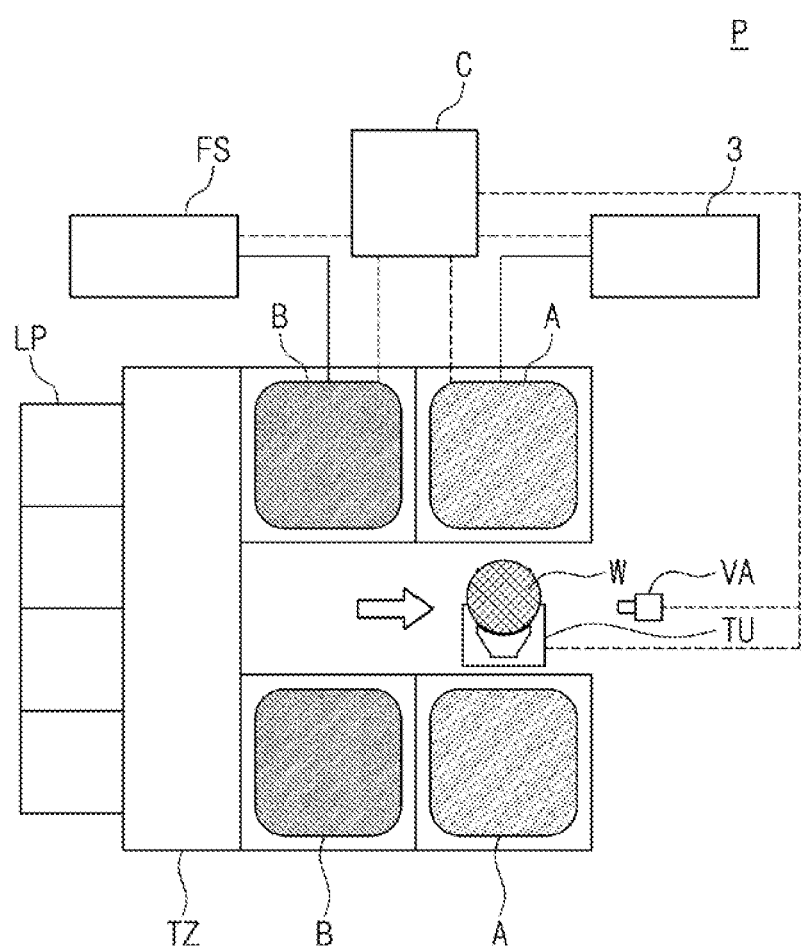

Referring to FIGS. 12 and 6, the unloading of the substrate from the substrate processing chamber (in S21) may include unloading the substrate W from the substrate processing chamber B using the transfer unit TU.

Figure 13:
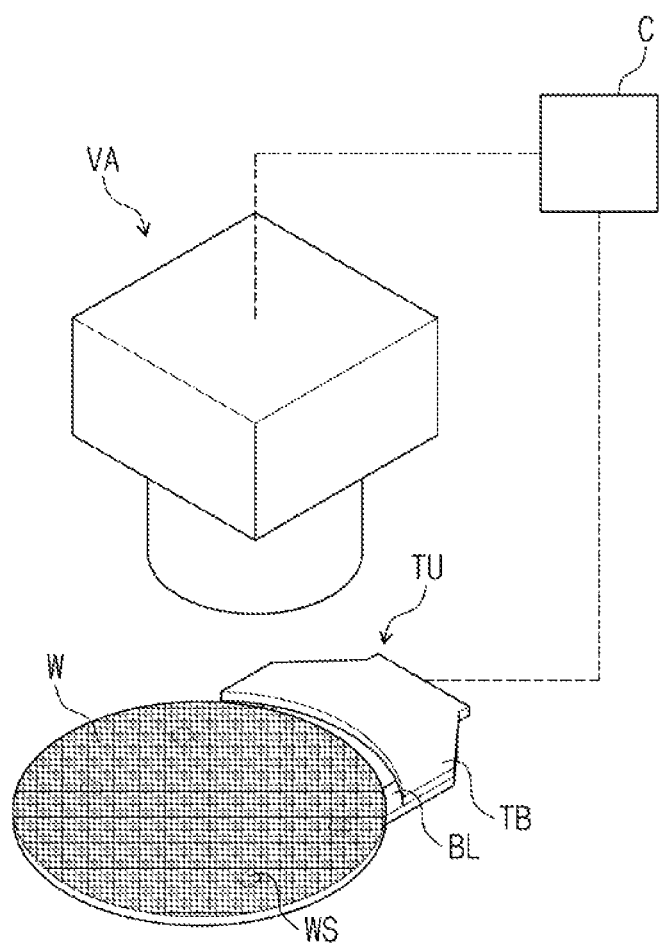

Referring to FIGS. 13 and 6, the measuring of the weight of the substrate using the second weight sensor (in S22) may include measuring the weight of the substrate W using the second weight sensor WS, which is provided on the supporting blade BL of the transfer unit TU, and transmitting the information to the controller C. The controller C may calculate an amount of the fluid on the substrate W, based on the weight information transmitted from the second weight sensor WS.

The obtaining of the image of the top surface of the substrate (in S23) may include obtaining an image of the top surface of the substrate W using the imaging device VA. The imaging device VA may transmit image information about the top surface of the substrate W, which is covered with the fluid, to the controller C. The controller C may estimate an amount of the fluid on the substrate W, based on the image information about the top surface of the substrate W.

The controller C may compare an amount of the fluid on the substrate W measured in the substrate processing chamber B with an amount of the fluid on the substrate W measured on the transfer unit TU. In the case where the amount of the fluid on the substrate W measured in the substrate processing chamber B is substantially equal to or similar to the amount of the fluid on the substrate W measured on the transfer unit TU, the controller C may perform the drying process in a conventional manner. By contrast, in the case where a difference between the amounts of the fluid on the substrate W measured in the substrate processing chamber B and on the transfer unit TU is larger than a specific value, the controller C may change a recipe for the drying process.

Referring back to FIGS. 12 and 6, the step of inserting the substrate into the drying chamber (in S24) may include inserting the substrate W into the drying chamber A using the transfer unit TU.

Figure 14:
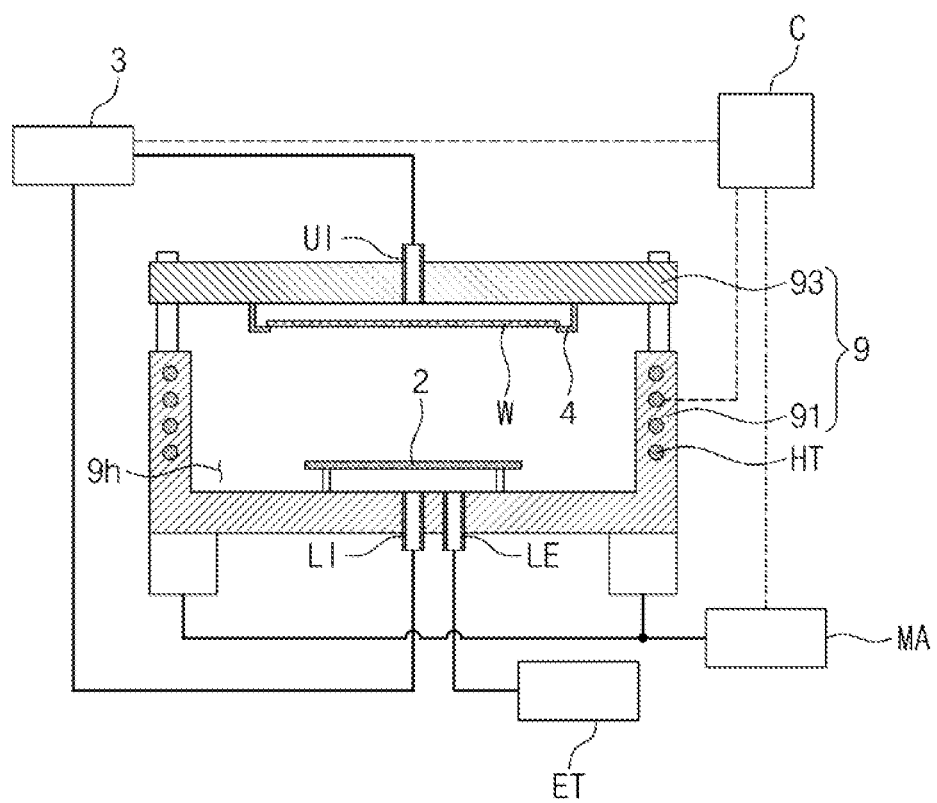

Referring to FIGS. 14 and 6, the step of disposing the substrate on the drying chuck (in S31) may include placing the substrate W on the drying chuck 4 using the transfer unit TU.

Figure 15:
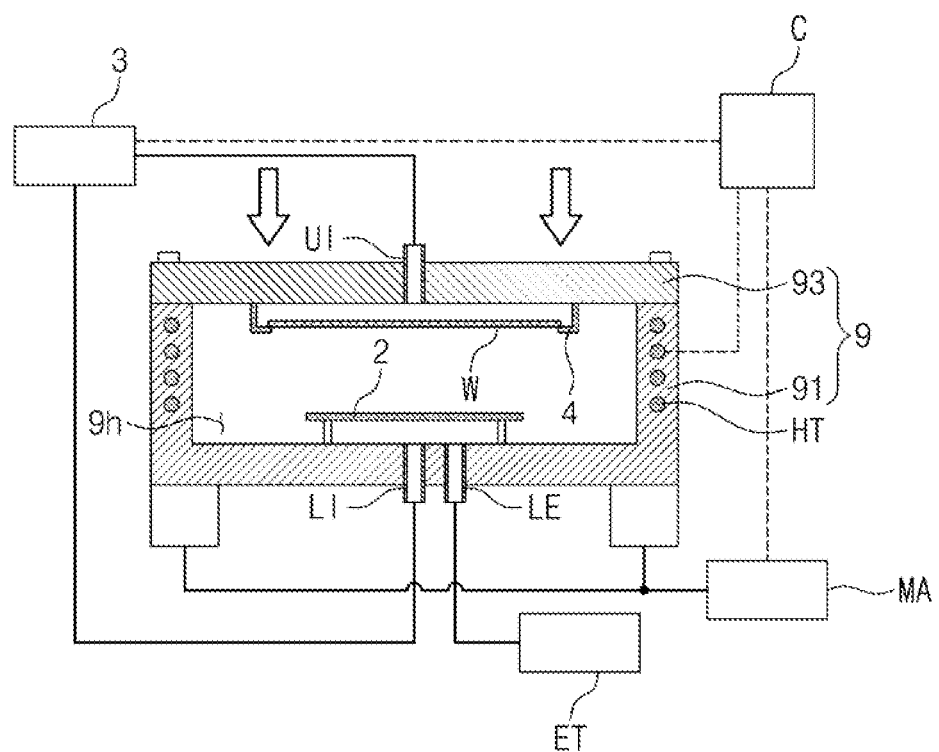

Referring to FIG. 15, a distance between the lower and upper chambers 91 and 93 may be reduced to isolate the drying space 9h from the outside. The distance between the lower and upper chambers 91 and 93 may be controlled by the chamber driving part MA.

Figure 16:
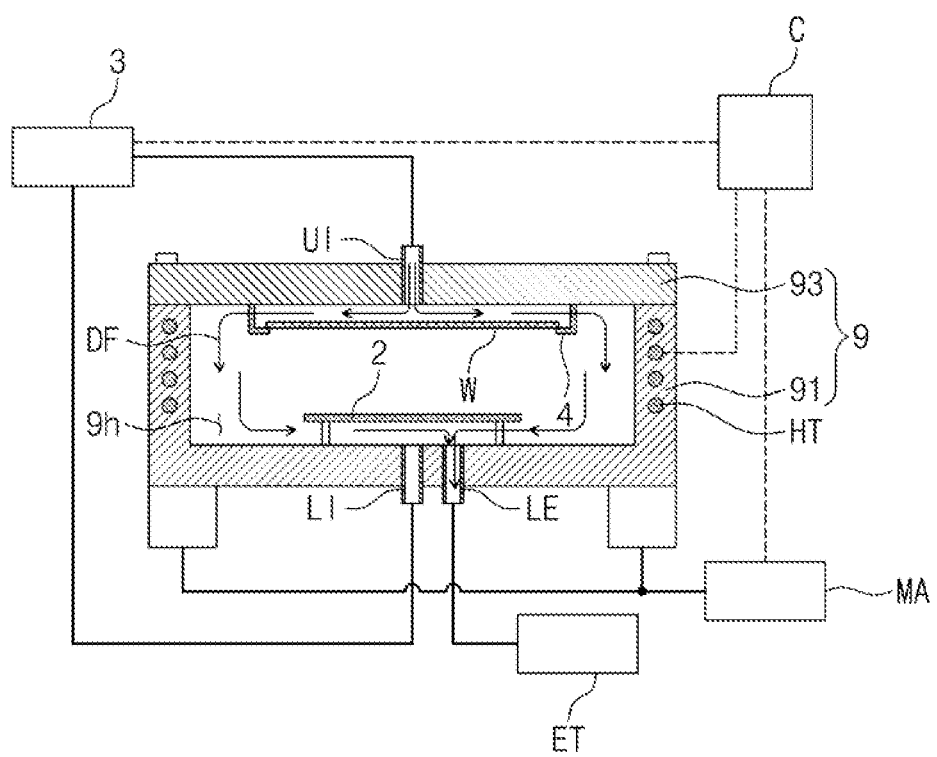

Referring to FIGS. 16 and 6, the spraying of the drying fluid onto the substrate (in S32) may include spraying a drying fluid DF into the drying space 9h using the drying fluid supplying part 3. The drying fluid DF may be the carbon dioxide in the supercritical fluid state, as described above, but embodiments are not limited to this example. The drying fluid DF may be used to remove the fluid from the surface of the substrate W. For example, the drying fluid DF may remove the fluid from the substrate W through chemical reaction with the fluid on the substrate W. Alternatively, the drying fluid DF may remove the fluid from the substrate W in a manner pushing out the fluid on the substrate W. Accordingly, the substrate W may be dried. During the drying process, the drying heater HT may heat the drying fluid DF. This may make it possible to maintain the drying fluid DF in its supercritical state.

As described above, in the case where the amount of the fluid on the substrate W measured in the substrate processing chamber B is substantially equal to or similar to the amount of the fluid on the substrate W measured on the transfer unit TU, the controller C may perform the drying process in a conventional manner. In other words, the drying process may be performed, based on predetermined values for a supplying amount and a supplying time of the drying fluid DF.

By contrast, in the case where a difference between the amounts of the fluid on the substrate W measured in the substrate processing chamber B and on the transfer unit TU is larger than a specific value, the controller C may change a recipe for the drying process. For example, in the case where the amount of the fluid on the substrate W measured on the transfer unit TU is smaller than a specific value, the controller C may control the drying fluid supplying part 3. More specifically, if the amount of fluid on the substrate W is too low, the supplying time and/or supplying amount of the drying fluid DF may be reduced by the controller C. By contrast, if the fluid on the substrate W is excessive, the supplying time and/or supplying amount of the drying fluid DF may be increased by the controller C. Accordingly, the drying process may be performed under an optimized condition for the amount of the fluid on the substrate W.

Figure 17:
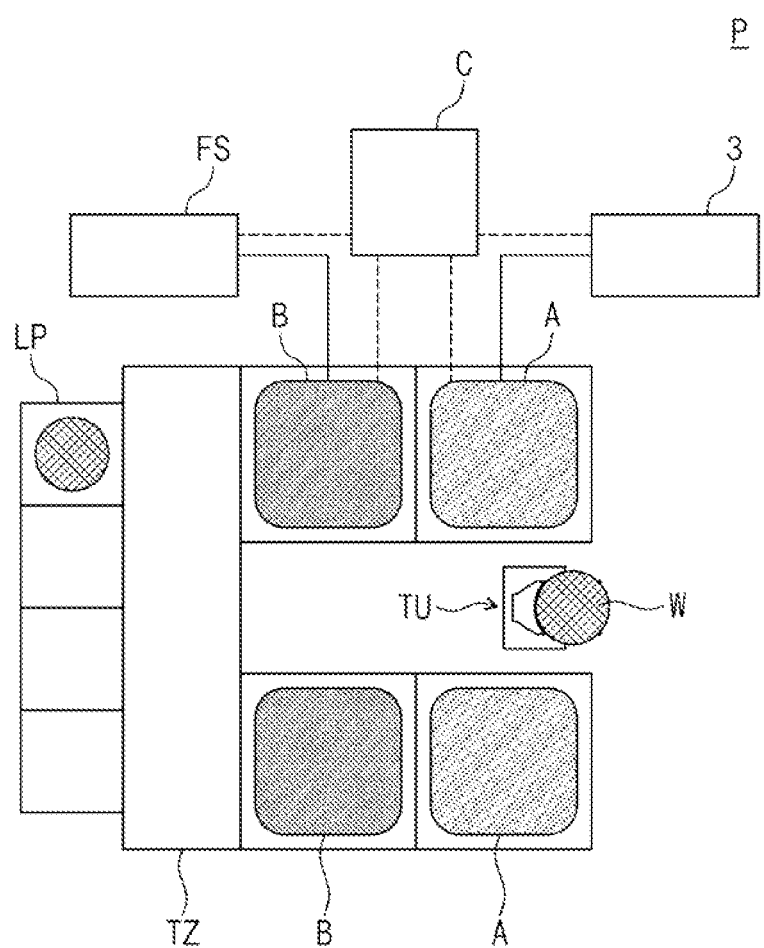

Referring to FIG. 17, if the drying process is finished, the substrate W may be unloaded from the drying chamber A. The substrate W may be transferred to another system for a subsequent process by the transfer unit TU. Thereafter, another substrate may be loaded on the loading port LP, and the afore-described process may be repeated.

In a substrate processing chamber according to an example embodiment, a substrate processing system including the same, and a substrate processing method using the same, it may be possible to precisely control a wetting amount of a substrate in a wetting process. More specifically, the wetting amount of the substrate may be precisely determined by measuring an amount of fluid on the substrate using a weight sensor, and this may make it possible to precisely control an amount of the fluid existing on the substrate. Thus, it may be possible to precisely control the wetting amount of the substrate to be processed by a drying process. As a result, it may be possible to prevent a substrate defect, which is caused by a difference in the wetting amount in the drying process. If the wetting amount is excessive, many substrate defects may occur in the drying process, in which supercritical fluid is used. According to an example embodiment, since the amount of the fluid in the wetting process is monitored before the drying process and is precisely controlled, it may be possible to minimize the substrate defect in the drying process and consequently to increase a yield in a semiconductor fabrication process.

In a substrate processing chamber according to an example embodiment, a substrate processing system including the same, and a substrate processing method using the same, a wetting amount may be determined by measuring a weight of a substrate in the substrate processing chamber. More specifically, the wetting amount of the substrate may be measured, when the substrate is loaded on a spin apparatus. Thus, in the case where, due to an inappropriate wetting amount of the substrate, it is necessary to rotate the substrate again or to spray fluid again, the required process can be quickly performed. That is, on the spot (e.g., without unloading the substrate from the substrate processing chamber), it may be possible to monitor the wetting amount of the substrate and perform a subsequent necessary action. This may make it possible to reduce process time.

In a substrate processing chamber according to an example embodiment, a substrate processing system including the same, and a substrate processing method using the same, a weight of a substrate may be additionally measured during transferring the substrate. For example, it may be possible to monitor a wetting amount of the substrate, before inserting the substrate into a drying chamber. Accordingly, if necessary, a recipe for a drying process may be immediately changed to be suitable for the wetting amount of the substrate. For example, in the case where a wetting amount of the substrate, which is measured when the substrate is not yet inserted in the drying chamber, is different from a wetting amount measured in the substrate processing chamber, a predetermined recipe for the drying process may be changed to prevent a substrate defect from occurring. Thus, it may be possible to cope with various situations which may occur during the substrate transferring step and thereby to increase a yield in a semiconductor fabrication process.

In a substrate processing chamber according to an example embodiment, a substrate processing system including the same, and a substrate processing method using the same, it may be possible to prevent a weight sensor from being contaminated or damaged, because the weight sensor is buried in a spin chuck. In addition, since only the spin chuck is a part that needs to be replaced, most of other parts of the chamber can be used as they are.

In a substrate processing chamber according to an example embodiment, a substrate processing system including the same, and a substrate processing method using the same, it may be possible to monitor a wetting amount.

In a substrate processing chamber according to an example embodiment, a substrate processing system including the same, and a substrate processing method using the same, it may be possible to precisely control a wetting amount.

In a substrate processing chamber according to an example embodiment, a substrate processing system including the same, and a substrate processing method using the same, it may be possible to efficiently perform a drying process.

In a substrate processing chamber according to an example embodiment, a substrate processing system including the same, and a substrate processing method using the same, it may be possible to prevent a defect from occurring on a substrate and to increase a yield in a fabrication process.

In a substrate processing chamber according to an example embodiment, a substrate processing system including the same, and a substrate processing method using the same, it may be possible to reduce process time.

While example embodiments have been particularly shown and described, it will be understood by one of ordinary skill in the art that variations in form and detail may be made therein without departing from the spirit and scope of the attached claims.

What is claimed is:

1. A substrate processing chamber comprising:
   a housing providing a process space;
   a spin apparatus provided in the housing; and
   a fluid spraying nozzle configured to spray fluid into the process space,
   wherein the spin apparatus comprises:
      a spin chuck configured to support a substrate;
      a rotation driving part configured to rotate the spin chuck;
      a weight sensor configured to measure a weight of the substrate supported on the spin chuck;
      supporting pins provided on the spin chuck, spaced apart from each other along a circumference of the spin chuck, and in contact with a bottom surface of the substrate; and fastening pins fastening the substrate disposed on the supporting pins.

2. The substrate processing chamber of claim 1, wherein the weight sensor is disposed in the spin chuck.

3. The substrate processing chamber of claim 1, wherein the weight sensor comprises a load cell.

4. The substrate processing chamber of claim 1, wherein the spin chuck comprises polytetrafluoroethylene.

5. The substrate processing chamber of claim 1, further comprising a bowl enclosing the spin apparatus.

6. A substrate processing system comprising:
a substrate processing chamber;
a fluid supplying part configured to supply fluid into the substrate processing chamber;
a drying chamber configured to dry a substrate transferred from the substrate processing chamber;
a drying fluid supplying part configured to supply a drying fluid into the drying chamber; and
a transfer unit configured to transfer the substrate from the substrate processing chamber to the drying chamber,
wherein the substrate processing chamber comprises:
a housing providing a process space;
a spin apparatus provided in the housing; and
a fluid spraying nozzle configured to spray the fluid into the process space, and
wherein the spin apparatus comprises:
a spin chuck configured to support and rotate the substrate; and
a weight sensor configured to measure a weight of the substrate disposed on the spin chuck;
supporting pins provided on the spin chuck, spaced apart from each other along a circumference of the spin chuck, and in contact with a bottom surface of the substrate; and
fastening pins fastening the substrate disposed on the supporting pins.

7. The substrate processing system of claim 6, wherein the transfer unit comprises:
a transfer body;
a supporting blade connected to the transfer body and configured to support the substrate; and
a second weight sensor connected to the supporting blade and configured to measure the weight of the substrate supported on the supporting blade.

8. The substrate processing system of claim 6, wherein the drying chamber comprises:
a drying housing providing a drying space; and
a drying chuck provided in the drying space, and on which the substrate transferred from the substrate processing chamber is loaded, and
wherein the drying fluid supplying part is further configured to spray the drying fluid to the substrate loaded on the drying chuck.

9. The substrate processing system of claim 6, further comprising a controller configured to receive information about the weight of the substrate, which is supported on the spin chuck, from the weight sensor and to control a rotation number of the spin chuck, a rotation speed of the spin chuck, or an amount of the fluid supplied into the process space from the fluid supplying part.

10. The substrate processing system of claim 6, further comprising an imaging device configured to obtain an image of a top surface of the substrate disposed on the transfer unit.

* * * * *